(12) United States Patent
Watanabe

(10) Patent No.: US 6,543,039 B1
(45) Date of Patent: Apr. 1, 2003

(54) METHOD OF DESIGNING INTEGRATED CIRCUIT AND APPARATUS FOR DESIGNING INTEGRATED CIRCUIT

(75) Inventor: Susumu Watanabe, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/401,500

(22) Filed: Sep. 22, 1999

(30) Foreign Application Priority Data

Sep. 29, 1998 (JP) .......................... 10-275596

(51) Int. Cl.⁷ .............................................. G06F 17/50
(52) U.S. Cl. ................................. 716/7; 716/2
(58) Field of Search .......................... 716/7, 2

(56) References Cited

U.S. PATENT DOCUMENTS

| | | | | |
|---|---|---|---|---|
| 5,566,078 A | * | 10/1996 | Ding et al. ..................... | 716/8 |
| 5,872,718 A | * | 2/1999 | Scepanovic et al. ........... | 716/8 |
| 5,909,376 A | * | 6/1999 | Scepanovic et al. ........... | 716/8 |
| 6,031,980 A | * | 2/2000 | Oota ............................. | 716/8 |
| 6,134,702 A | * | 10/2000 | Scepanovic et al. .......... | 716/10 |
| 6,155,725 A | * | 12/2000 | Scepanovic et al. ........ | 709/213 |
| 6,189,130 B1 | * | 2/2001 | Gofman et al. ................ | 716/7 |

FOREIGN PATENT DOCUMENTS

| | | |
|---|---|---|
| JP | 03-150837 | 6/1991 |
| JP | 06-104161 | 4/1994 |
| JP | 10-221836 | 8/1998 |

* cited by examiner

Primary Examiner—John F. Niebling
Assistant Examiner—Stacy A Whitmore
(74) Attorney, Agent, or Firm—Foley & Lardner

(57) ABSTRACT

An integrated circuit design method and an integrated circuit design apparatus, for increasing an efficiency of parallel processing of LSI design layout data while retaining a hierarchical structure by use of a computer capable of processing the data in parallel, take a first construction of making an internal cell composed of divided cells obtained by dividing a design cell specified by design cell data among pieces of integrated circuit design layout data on the basis of a cell division judging criterion, and of non-divided design cells other than the divided cells, then creating a plurality of unit groups of which data quantities are substantially equal to each other by combining the internal cells, and executing hierarchical parallel processing of the data contained in the internal cell per unit group, and take a second construction of restoring a non-overlapped array data region left by excluding a data region having overlapped data from an array data region containing array data among pieces of integrated circuit design layout data, with a combination of a plurality of or a single piece of array cell or unit cell.

6 Claims, 14 Drawing Sheets

INTERNAL CELL
ID NUMBER TABLE

INTERNAL CELL
ID NUMBER TABLE
(SORTED BY NUMBERS)

INTERNAL CELL NUMBERS AND LAYOUT
COORDINATES OF UNIT GROUPS

UNIT1(460,590)    ③(A3;x,y)、⑦(C;x,y)、⑨(E;x,y)

UNIT2(498,000)    ②(A2;x,y)、⑧(D;x,y)

UNIT3(496,000)    ④(A4;x,y)、⑥(B2;x,y)

UNIT4(491,000)    ①(A1;x,y)、⑤(B1;x,y)

FIG. 9

MASK DATA PROCESSING OPERATION FILE
OF A UNIT GROUP

TYPE1
6×2
5×1
3×3
2×1
3×2

TYPE2
1×2
3×3
2×6
3×1
4×2

TYPE3
1×2
5×3
3×1
2×1
6×2

TYPE4
6×2
5×1
3×3
1×2
2×3

TYPE5
1×2
5×3
3×3
2×1
3×2

TYPE6
1×2
3×3
2×6
3×3
1×2

METHOD OF DESIGNING INTEGRATED CIRCUIT AND APPARATUS FOR DESIGNING INTEGRATED CIRCUIT

BACKGROUND OF THE INVENTION

The present invention relates generally to a method of designing an integrated circuit and an apparatus for designing an integrated circuit, and more particularly to a hierarchical parallel processing method of LSI design layout data and an array restructuring method thereof, a CAD (Computer Assisted Design) tool for executing the same methods, and a recording medium recorded with a computer program for executing the same methods.

A layout of a large scale integrated (LSI) circuit has been hierarchically designed over the recent years, and therefore a method and an apparatus for processing design layout data at a high speed have involved the use of a method of processing the design layout data as its hierarchical structure is retained as it is, and a CAD tool. In this case, each of design cells structuring the hierarchical structure is treated in an as-is form of being the design cell.

On one hand, the CAD tool for processing in parallel the design layout data by use of a computer incorporating a plurality of tightly-coupled CPUs or a plurality of computers connected to a network, is used as a technology separate from the hierarchical data processing method.

All of these contrivances aim at speeding up the design layout data processing and reducing an operation-oriented storage file.

On the other hand, for speeding up the processing of the design layout data having a hierarchical structure and reducing the operation-oriented storage file, it is an importance point how an array cell expressed by repetitive pattern data is efficiently treated. The array cell normally involves the use of a secondary array with a large number of repetitions for a general-purpose memory product, and is also used for a memory device such as a RAM and a ROM of a microcomputer. In the case of hierarchically treating the LSI design layout data, when pattern data, cell data or other array data are so laid out as to be overlapped with an array cell data region, it is a data processing method which has hitherto been carried out that the array cell data is developed or converted into unit layout cell data and thus processed.

FIG. 18 is an explanatory diagram showing one example of a layout of an LSI having a hierarchical structure. FIG. 19 is a block diagram showing the hierarchical structure of the LSI shown in FIG. 18.

In the layout of he LSI shown in FIG. 18, as illustrated in the block diagram in FIG. 19, two pieces of cells A, one single cell B and six pieces of cells E are laid out on a Cell ROOT constituting one chip. Further, three pieces of cells C and two pieces of cells D are hierarchically laid out on the cell B. Herein, it is assumed that a size of the Cell ROOT be on the order of 10000 $\mu$m×10000 $\mu$m, a size of the cell A be on the order of 2000 $\mu$m×8000 $\mu$m, a size of the cell B be on the order of 3000 $\mu$m×3000 $\mu$m, a size of the cell C be on the order of 700 $\mu$m×700 $\mu$m, a size of the cell D be on the order of 1800$\mu$m×600 $\mu$m, and a size of the cell E be on the order of 500$\mu$m×1000 $\mu$m.

When treating the data while retaining the hierarchical structure of the LSI design layout, the cell has hitherto been dealt with in the as-is form of being the design cell irrespective of a magnitude (a magnitude of a data size) of the number of patterns contained in the design cell, or regardless of a magnitude of the size thereof. For instance, in the example shown in FIG. 18, there are considerable differences in terms of their sizes between the cell ROOT, the cell A, the cell B, the cell C, the cell D and the cell E, and hence these cells ROOT, A, B, C, D and E are treated in their as-designed forms regardless of a considerable difference in the number of patterns contained in the respective cells, i.e., in the data size therebetween. Therefore, when processing the design layout data in parallel by use of a computer incorporating a plurality of tightly-coupled CPUs or by use of a plurality of computers connected to a network, for example, the cell A and the cell E, which are considerably different in size, are treated as processed units at the same level. In an extreme case, a design cell containing only several pieces of pattern data, and an enormous design cell containing several millions of pieces of pattern data are treated as the processed units at the same level.

As a result, there arises the following big problem in the conventional parallel processing of the design layout data.

First, there are treated extremely various types of design cells and, in an extreme case, over several thousands of types of design cells, which leads to an increase in an overhead time for pre-processing/post-processing for starting up a job for executing the parallel processing.

Second, a data quantity of each design cell to be processed in parallel is not uniform and hence each parallel processing time is not uniform. The processing time for the enormous design cells is dominant as an element for determining a time length of the parallel processing time, with the result that an effect of the parallel processing is unable to exhibit.

Further, according to the prior art, when hierarchically treating the LSI design layout data, as in the case of the cells c and D disposed on the cell B, when the pattern data, the cell data or other array data are so disposed as to be overlapped with the array cell data region, the array cell data is developed or converted into unit layout cell data and thus processed. Therefore, it follows that a tremendous number of pieces of pattern data and unit layout cell data are to be treated. This might cause a problem in which the processing time elongates, and a problem in which a large capacity of operation-oriented storage file is needed.

SUMMARY OF THE INVENTION

It is a primary object of the present invention to provide an integrated circuit design apparatus and an integrated circuit design method which are capable of enhancing an efficiency of parallel processing of LSI design layout data while retaining a hierarchical structure by use of a computer capable of processing data in parallel.

According to a first aspect of the present invention, there is provided a method of designing an integrated circuit, comprising:

a step of making an internal cell composed of divided cells obtained by dividing a design cell specified by design cell data among pieces of integrated circuit design layout data on the basis of a cell division judging criterion, and of non-divided design cells other than the divided cells; and a step of creating a plurality of unit groups of which data quantities are substantially equal to each other by combining the internal cells, and executing hierarchical parallel processing of the data contained in the internal cell per unit group.

According to a second aspect of the present invention, there is provided a method of designing an integrated circuit, comprising:

a first step of sequentially reading design cell data about design cells among pieces of integrated circuit design layout data stored in storage section;

a second step of, with reference to the design cell data and a predetermined cell division judging criterion, dividing into divided cells the design cell among the design cells which exceeds the cell division judging criterion, converting the design cell data into internal cell data about an internal cell consisting of the divided cell and the design cell other than the divided cell, storing the internal cell data in an internal format file created in said storage section, and recording a variety of information for identifying the respective internal cells and a quantity of the data contained in each internal cell in an internal cell identification number table created in said storage section;

a third step of repeating said first step and said second step till said first and second steps are completed with respect to all pieces of design cell data;

a fourth step of creating a plurality of unit groups by combining the internal cells so that the quantity of the data becomes approximates to a predetermined reference data quantity with reference to the quantity of the data contained in each internal cell which is registered in the internal cell identification number table, and registering the variety of information for identifying the respective unit groups in a unit group table created in said storage section; and a fifth step of processing the internal cell data stored in the internal format file under parallel processing control per unit group with reference to the internal cell identification number table and the unit group.

According to a third aspect of the present invention, there is provided a method of designing an integrated circuit, comprising:

a first step of sequentially reading array data among pieces of integrated circuit design layout data stored in storage section;

a second step of restoring a non-overlapped array data region left by excluding a data region having overlapped data from an array data read in the first step, with a combination of a plurality of or a single piece of array cell or unit cell.

According to a fourth aspect of the present invention, there is provided a method of designing an integrated circuit, comprising:

a first step of sequentially reading array data among pieces of integrated circuit design layout data stored in storage section;

a second step of setting the read-out array data as reference array data, and registering the array data as "non-overlapped" data in an overlap element identification-oriented storage file created in said storage section;

a third step of identifying the data overlapped with an array cell element in a reference array data region in which to set the reference array data from the integrated circuit design layout data stored in said storage section, and writing the "overlapped" data to the data of the overlap element identification-oriented storage file which corresponds to the overlap array cell element having the overlapped data; and a fourth step of reading the overlap element identification-oriented storage file from said storage section, and restoring a non-overlapped array data region left by excluding the cell data of the overlap element cell contained in the overlap array cell element from the reference array data region, with a combination of a plurality of or a single piece of array cell or unit cell.

BRIEF DESCRIPTION OF THE DRAWINGS

In the accompanying drawings,

FIG. 7 is an explanatory diagram showing one example of contents of an internal cell identification number table created when converting and writing the cell data;

FIG. 8 is an explanatory diagram showing one example of contents of the internal cell identification number table after rearranging an internal cell registration sequence in which the internal cells with smaller numbers of patterns contained therein are sorted more anterior;

FIG. 9 is an explanatory diagram showing one example of contents of internal cell numbers of unit groups, and of a layout coordinate table;

DESCRIPTION OF THE PREFERRED EMBODIMENTS

Embodiments of an integrated circuit design method, an integrated circuit design apparatus and a recording medium recorded with a computer program for executing the same design method, will hereinafter be described with reference to the accompanying drawings.

Figure 1:
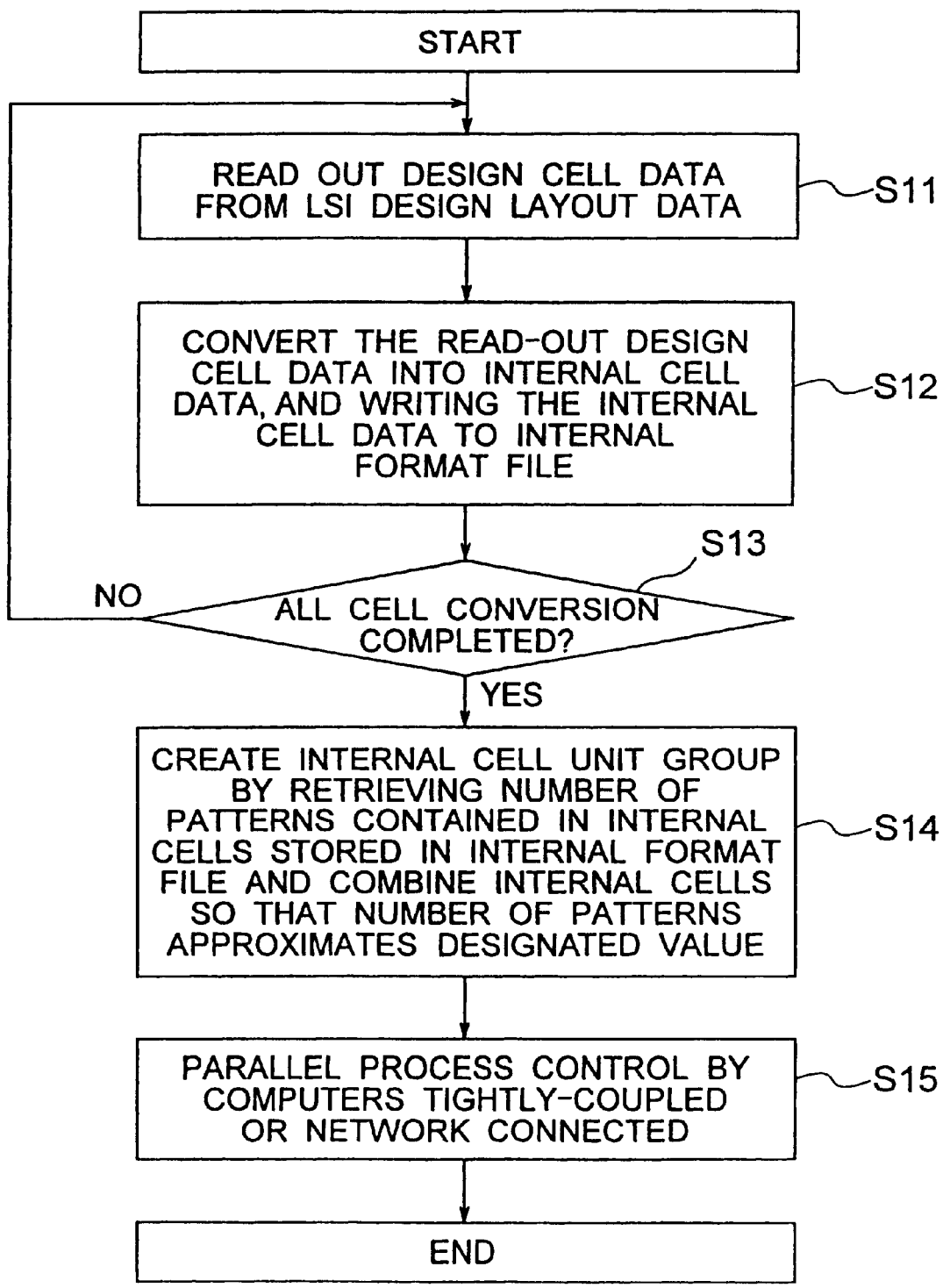
FIG. 1 is a flowchart showing a procedure of an integrated circuit design method in a first embodiment of the present invention.
Figure 2:
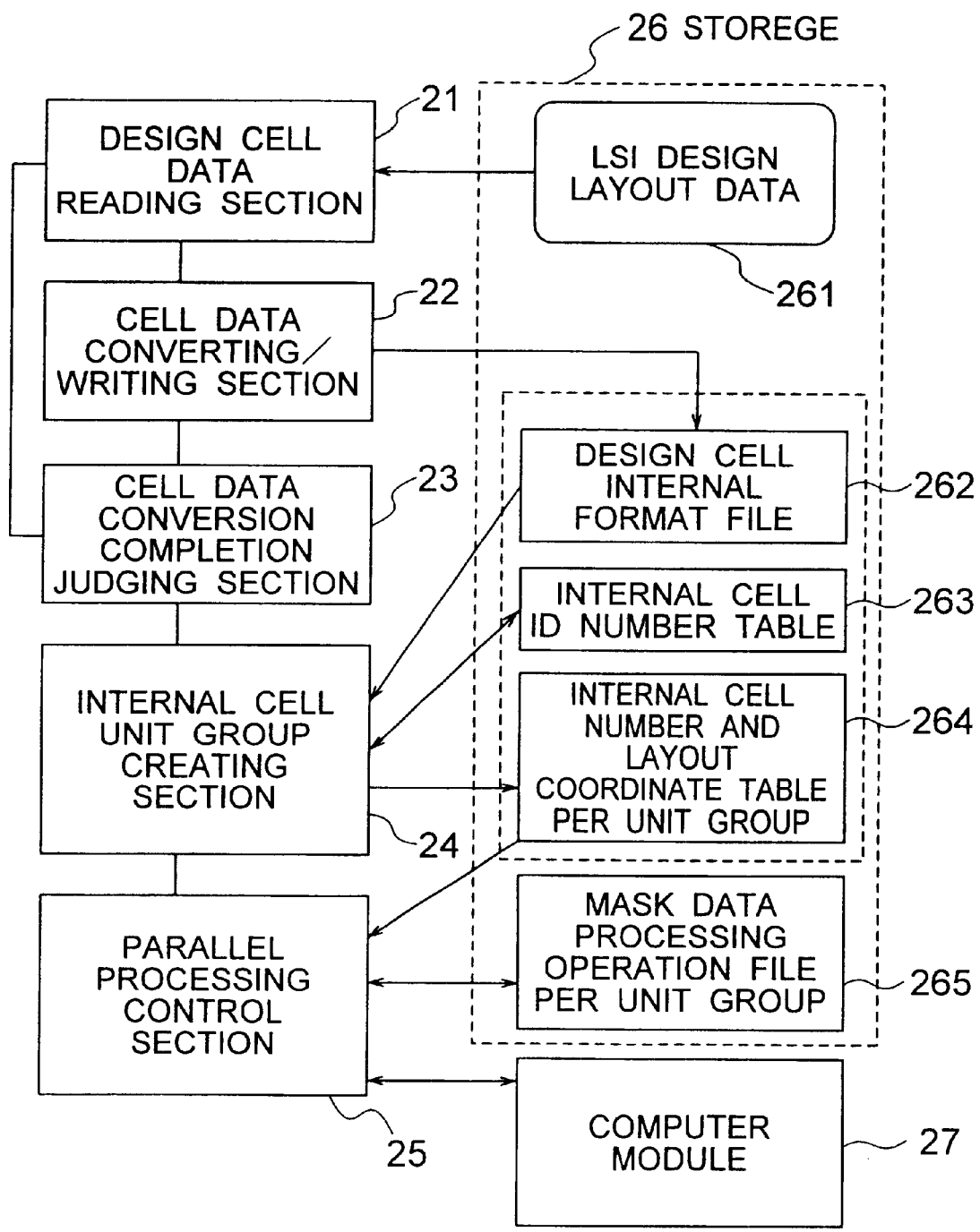
FIG. 2 is a block diagram showing a construction of an integrated circuit design apparatus in the first embodiment of the present invention.

FIG. 1 is a flowchart showing a procedure of the integrated circuit design method in a first embodiment of the present invention. FIG. 2 is a block diagram showing a construction of the integrated circuit design apparatus in the first embodiment of the present invention. The integrated circuit design method and the integrated circuit design apparatus in the first embodiment of the present invention, are related to a hierarchical parallel processing method of LSI design layout data and to an array cell restructuring method thereof.

The integrated circuit design apparatus in the first embodiment of the present invention is, as shown in FIG. 2, constructed of a storage 26 for storing various items of data such as LSI design layout data etc, a computer module 27 capable of processing the data in parallel such as a computer incorporating a plurality of tightly-coupled CPUs or a plurality of computers connected to a network etc, a design cell data reading section 21 for reading design cell data from the LSI design layout data stored in the storage 26, and a cell data converting/writing section 22 for converting the read-out design cell data into internal cell data of an internal cell consisting of a design cell having a size smaller than a predetermined specified size and a divided cell into which a specified cell having a size larger than the specified size is divided, and writing the internal cell data in an internal format file. The integrated circuit design apparatus is constructed further of a cell data conversion completion judging section 23 for judging whether or not the conversions of all pieces of cell data are completed, an internal cell unit group creating section 24 for retrieving the number of patterns of the internal cells stored in the internal format file and creating a internal cell unit group so that the number of patterns becomes approximate to a predetermined value, and a parallel processing control section 25 for controlling the parallel processing of the design cell data per unit group by use of the computer capable of processing the data in parallel such as the computer incorporating the plurality of tightly-coupled CPUs or the plurality of computers connected to the network.

The integrated circuit design method in the first embodiment of the present invention, shown in FIG. 1, is carried out in the following way by using the integrated circuit design apparatus in the first embodiment of the present invention, illustrated in FIG. 2.

To begin with, the design cell data reading section 21 sequentially reads the design cell data from the LSI design layout data 261 stored in the storage 26 (step S11).

Next, the cell data converting/writing section 22 converts the read-out design cell data into the internal cell data, and writing the internal cell data to an internal format file 262 created in the storage 26 (step S12). Herein, the conversion of the design cell data into the internal cell data implies a process of dividing, into the divided cell, a cell among the design cells, of which a dimension exceeds a predetermined cell division judging dimension and of which the number of patterns contained exceeds a predetermined cell division judging number of patterns, and converting the design cell data into the internal cell data about the internal cell consisting of the divided cell and the non-divided design cell. The divided original design cell contains only reference information on the divided cell after being divided, and is, as a cell containing no pattern data, converted and created into the same hierarchy as that of the original design cell. The pattern data contained in the original design cell is divided and stored in the divided cell after being divided. Further, when converting and writing the cell data, an internal cell identification number table 263 is created in the storage 26, and a name and an identification number are labeled to each internal cell and thus registered. The number of patterns, which is contained in the internal cell, is also registered in the internal cell identification number table 263.

The cell data conversion completion judging section 23 judges whether or not the reading of the design cell data and the conversion and the writing of the cell data in steps S11 and S12 are completed with respect to all pieces of the cell data (step S13). Steps S11 and S12 are repeated till the reading of the design cell data and the conversion and the writing of the cell data are completed with respect to all pieces of the cell data.

After the reading of the design cell data and the conversion and the writing of the cell data have been completed with respect to all pieces of the cell data, the internal cell unit group creating section 24, with the reference to the internal cell identification number table 263, retrieves the number of patterns which is contained in each of the internal cells stored in the internal format file 262, and combines the internal cells so that the number of patterns approximates the predetermined value, thus creating the internal cell unit group (step S14). On this occasion, a unit group table 264 is created in the storage 26, and names, identification numbers and layout coordinates of the internal cells included in each unit group are registered in this table 264. Further, a mask data processing operation file 265 in which the internal cells are disposed at a predetermined spacing is created in the storage 26 per unit group in accordance with the unit group table 264.

Finally, the parallel processing control section 25, referring to the internal cell identification number table 263, the unit group table 264 and the mask data processing operation file 265, processes each piece of the internal cell data stored in the internal format file 262 under the parallel processing control per unit group by use of the computer 27 (step S15), thereby finishing the hierarchical parallel processing of the LSI design layout data by the integrated circuit design method and the integrated circuit design apparatus in accordance with the first embodiment of the present invention.

According to the integrated circuit design method and the integrated circuit design apparatus in the first embodiment of the present invention, the internal cell consists of the divided cell obtained by dividing the design cell specified by the design cell data among pieces of the integrated circuit design layout data on the basis of a cell division judging criterion, and of the non-divided design cell other than the divided cell, and the internal cells are combined, thus creating the plurality of unit groups of which data quantities are substantially equal to each other. Then, the hierarchical parallel processing of the data contained in the internal cell is executed per unit group, whereby times for per-unit-group data processes executed in parallel are substantially equalized and the hierarchical parallel processing of the LSI design layout data can be executed most efficiently.

The integrated circuit design method and the integrated circuit design apparatus in the first embodiment of the present invention will hereinafter be described in greater details by giving a more specific example.

Figure 3:
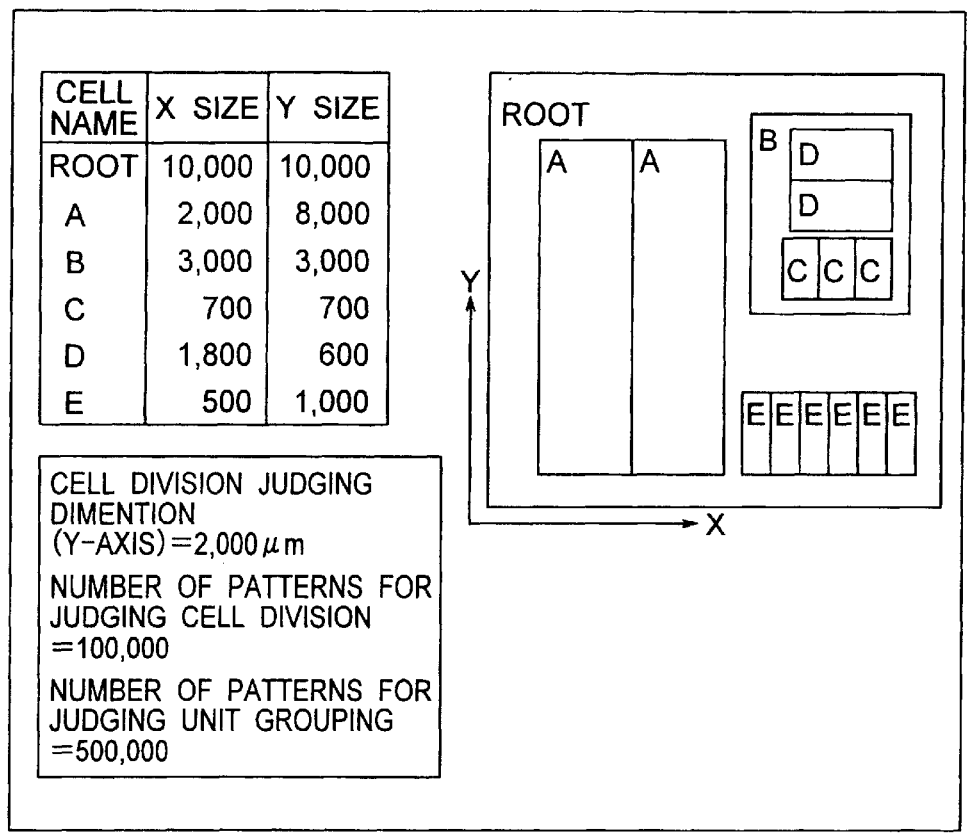
FIG. 3 is an explanatory diagram showing one example of a layout of an LSI having a hierarchical structure.
Figure 4:
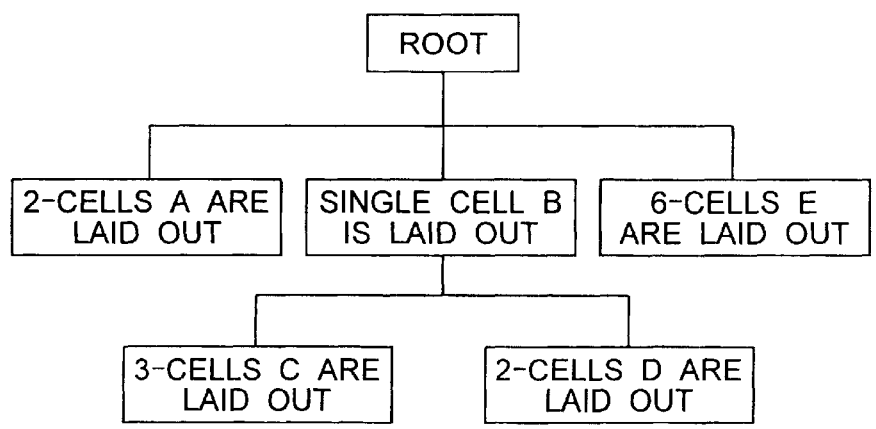
FIG. 4 is a block diagram showing the hierarchical structure of the LSI illustrated in FIG. 3.
Figure 18:
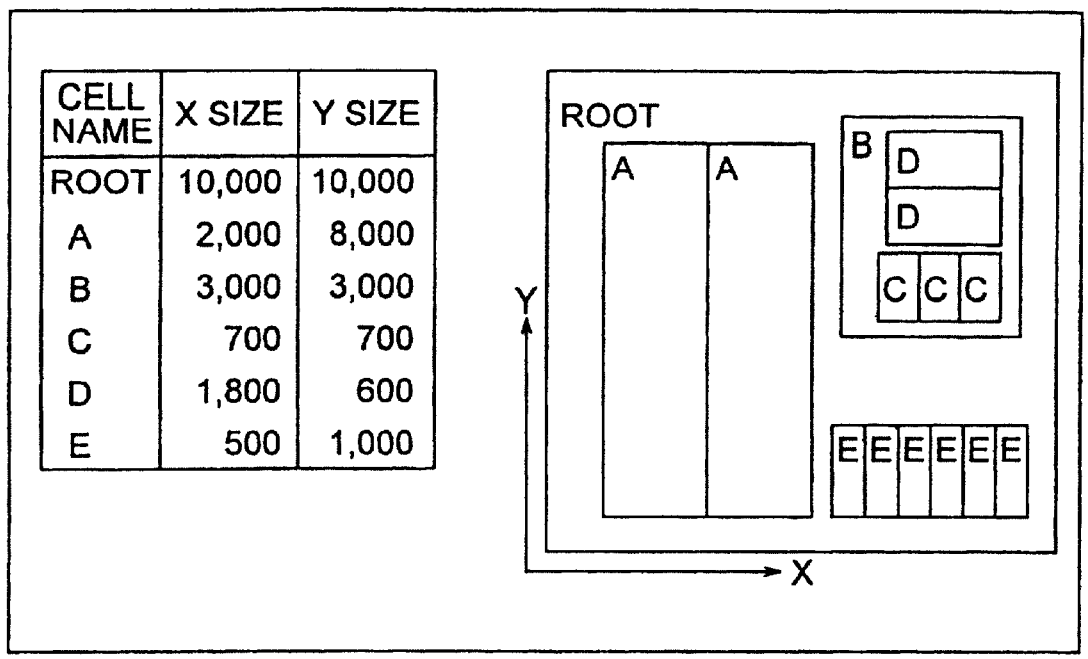
FIG. 18 is an explanatory diagram showing one example of a layout of an LSI having a hierarchical structure.
Figure 19:
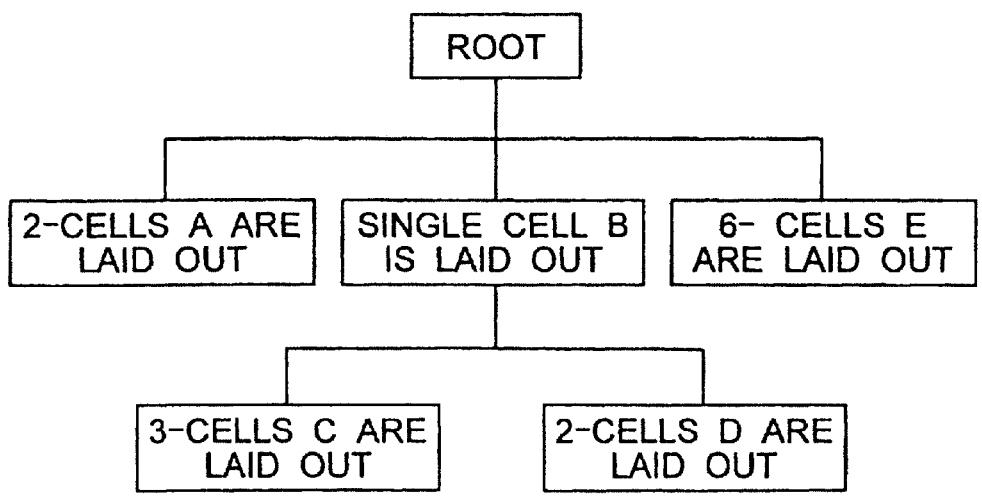
FIG. 19 is a block diagram showing the hierarchical structure of the LSI shown in FIG. 18.

FIG. 3 is an explanatory diagram showing one example of a layout of the LSI having the hierarchical structure. FIG. 4 is a block diagram of the LSI hierarchical structure illustrated in FIG. 3, showing an example similar to what is shown in FIGS. 18 and 19.

In the LSI layout shown in FIG. 3, as illustrated also in the block diagram in FIG. 4, two pieces of cells A, one single cell B and six pieces of cells E are laid out on a Cell ROOT constituting one chip. Further, three pieces of cells C and two pieces of cells D are hierarchically laid out on the cell B. Herein, it is assumed that an X- and Y-axial size of the Cell ROOT be given by 10000 $\mu$m×10000 $\mu$m, a size of the cell A be given by 2000 $\mu$m×8000 $\mu$m, a size of the cell B be given by 3000 $\mu$m×3000 $\mu$m, a size of the cell B be given by 3000 $\mu$m×3000 $\mu$m, a size of the cell C be given by 700 $\mu$m×700 $\mu$m, a size of the cell D be given by 1800 $\mu$m×600 $\mu$m, and a size of the cell E be given by 500 $\mu$m×1000 $\mu$m. It is also presumed that the number of patterns contained in each cell A be 1647000, the number in the cell B be 200000, the number in the cell C be 3860, the number in the cell D be 96000, and the number in the cell E be 8730. Further, in the first embodiment, the Cell ROOT does not contain the pattern data and has only the layout information on the two positions of the cells A, one position of the cell B and the six positions of the cells E.

Moreover, when converting the design cell data into the internal cell data, the criterion of judging whether or not the design cell should be divided is that a cell division judging dimension (in the direction of the Y-axis), it is assumed, be, specified to 2000 $\mu$m, and a cell division judging number of patterns be specified to 100000. Namely, when a dimension of the Y-axial side of the design cell exceeds 2000 $\mu$m and the number of patterns contained in the design cell exceeds 100000, the design cell concerned is divided into a plurality of divided cells in the direction of the Y-axis. Further, as a judging criterion when creating the unit group by combining the internal cells each consisting of the non-divided design cells and the divided cells on the basis of the above judging criterion, it is assumed that a unit group judging number of patterns be specified to 500000. That is, the unit group is created by combining the internal cells so that a total number of patterns does not exceed 500000 but becomes approximate to 500000 as much as possible. Note that the division is effected judging from only the dimension in the Y-axial direction as the cell division judging dimension in the first embodiment but may also be executed by specifying the cell division judging dimension with respect to the dimension in the X-axial direction.

Figure 5:
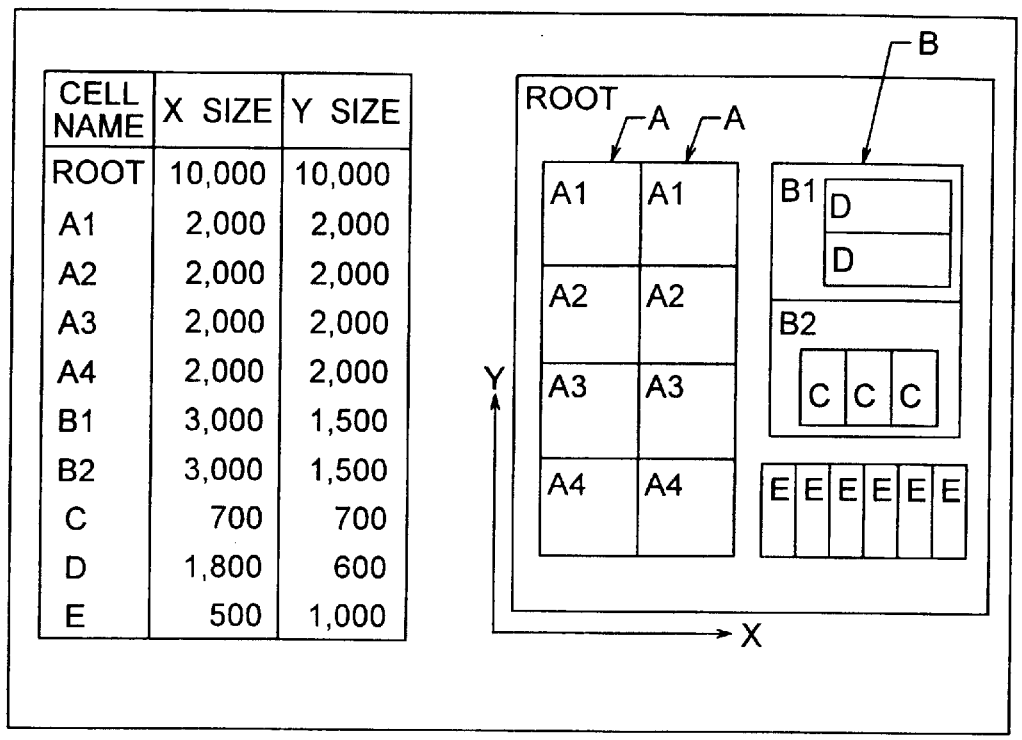
FIG. 5 is an explanatory diagram showing a state after converting, into an internal cell, a design cell in one example of the layout of the LSI having the hierarchical structure shown in FIG. 3.
Figure 6:
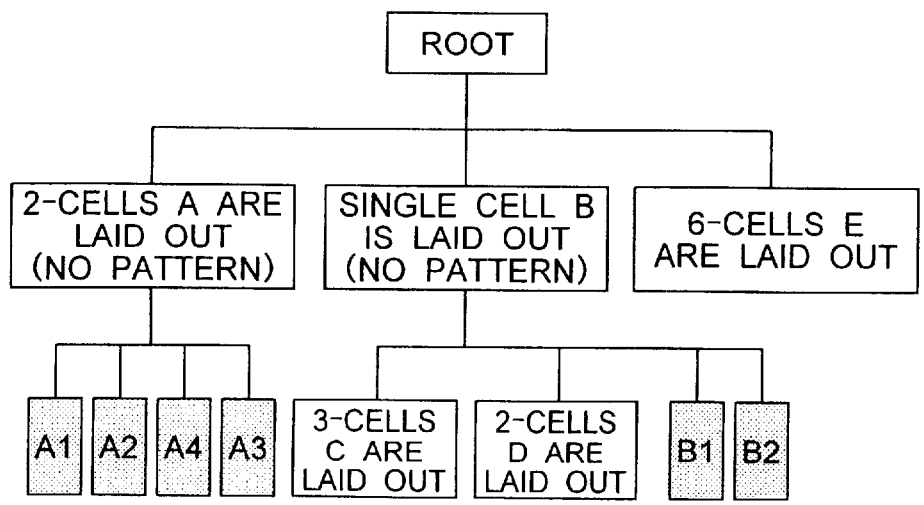
FIG. 6 is a block diagram showing the hierarchical structure of the LSI after the cell conversion shown in FIG. 5.

FIG. 5 is an explanatory diagram showing a state after the design cell in one example of the layout of the LSI having the hierarchical structure shown in FIG. 3 has been converted into the internal cell. FIG. 6 is a block diagram illustrating a hierarchical structure of the LSI after the cell conversion shown in FIG. 5 has been carried out.

The dimension of the Y-axial side of each of the cells A and B is over 2000 $\mu$m, and the number patterns contained therein exceeds 100000. Therefore, the cell A is divided in the Y-axial direction into cells A, A2, A3, A4, and the cell B is divided in the same direction into B1, B2. A size of each of the cells A1, A2, A3, A4 is 2000 $\mu$m×2000 $\mu$m, and a Y-direction side thereof has a dimension of 2000 $\mu$m or less. A size of each of the cells B. B2 is 3000 $\mu$m×1500 $\mu$m, and a Y-direction side thereof has a dimension of 2000 $\mu$m or under. Further, when dividing the cell, it is preferable that the cell be divided to have as equal size as possible in order to restrain an increase in the types of cells.

The hierarchical structure of the LSI after the cell conversion is, as shown in FIG. 6, that two pieces of free cells A, one single cell B and six pieces cells E are laid out on the Cell ROOT, the Cells A1, A2, A3, A4 are laid out in each of the two free cells A, and three cells C, two cells D, one cell B1 and one cell B2 are laid out on the single free cell B. The reason why the two cells A and one cell B disposed on the Cell ROOT are the free cells which do not contain the patterns, is that as a result of dividing the cell A into the cells A1, A2, A3, A4 and the cell B into the cells B1, B2, the pattern data contained in the cells A and B are so processed as to be divided into pieces of pattern data contained respectively in the cells A1, A2, A3, A4 and the cells B1, B2 and thus stored. Accordingly, after the cell conversion, the cells A and B are treated as the free cells having only the reference information of the cells A1, A2, A3, A4 and the cells B1, B2 . . . the hierarchical structure of the LSI after the cell conversion is that the three cells C, the two cells D, the cell B1 and the cell B2 are laid out on one single free cell B.

Further, the Cell ROOT does not contain the pattern data and has the layout information on the positions of the two cells S, one cell B and six cells E and is not therefore divided in spite of the fact that the Y-axis directional dimension of the Cell ROOT exceeds the cell division judging dimension of 2000 $\mu$m in the first embodiment. In the actual LSI design layout data, a higher-order hierarchy design cell such as the Cell ROOT of the highest-order hierarchy, though it has a dimension larger than the predetermined cell division judging dimension, has only the cell layout information but does not contain the pattern data, or contains, if any, a small quantity of pattern data. The division of such a design cell simply leads to the increase in the types of the internal cells and does not make any contribution to a speed-up of the processing which has been essentially aimed at. Such being the case, the design cell containing no pattern data, or the design cell containing only the patterns, of which the number is under the cell division judging number of patterns, is not subjected to the dividing process irrespective of magnitude of the cell dimensions.

As shown in FIG. 5 in the above discussion, the design cell in one example of the layout of the LSI having the hierarchical structure shown in FIG. 3 is converted into the internal cell, and the internal cell data about the internal cell after being converted is written to the internal format file created.

FIG. 7 is an explanatory diagram showing one example of contents of the internal cell identification number table created when converting and writing the cell data.

As shown in FIG. 7, the name and identification number for identifying each internal cell, and the number of patterns contained in each internal cell are registered in the internal cell identification number table. The contents of the internal cell identification number table shown in FIG. 7 are those immediately after creating the internal cell identification number table, wherein the registration sequence of the internal cells does not have a particular significance, and serial numbers are given as identification numbers in accordance with the registration sequence of the internal cells. The number of patterns contained in each of the cells into which the cells A, B are divided, is 389000 in the cell A1, 402000 in he cell A2, 458000 in the cell A3, 398000 in the cell A4, 102000 in the cell B1 and 98000 in the cell B2.

FIG. 8 is an explanatory diagram showing one example of the contents of the internal cell identification number table after rearranging the registration sequence of the internal cells in such a way that the cells with smaller numbers of patterns contained therein are sorted earlier.

For facilitating both a retrieval of the number of patterns contained in each internal cell and a creation of the unit group of the internal cells, the cells are sorted so that the registration sequence of the internal cells registered in the internal cell identification number table becomes such that the internal cell containing a smaller number of patterns is listed earlier. As a result, the registration sequence of the internal cells is that the cells are sorted in the sequence of the cell C, the cell E, the cell D, the cell B2, he cell B1, the cell A1, the cell A4, the cell S2 and the cell A3.

FIG. 9 is an explanatory diagram showing one example of the internal cell numbers of respective unit groups and contents of a layout coordinate table.

Cell numbers of the internal cells contained in the unit groups and layout coordinates in the unit groups are stored as pieces of information in the internal cell numbers of the unit groups and in the layout coordinate table shown in FIG. 9. The names of the internal cells, though stored therein, can be known by retrieving the internal cell numbers with reference to the internal cell identification number table and may not therefore be necessarily stored in the internal cell numbers of the unit groups and the layout coordinate table. A numerical value in the parentheses, which is put posterior to the unit number, indicates the number of patterns contained in each unit.

In the first embodiment, as discussed above, a unit group judging number of patterns is specified to 500000 as a judging criterion when creating the unit group created by combining the internal cells. Therefore, the number of patterns contained in each internal cell is retrieved with reference to the internal cell identification number table, and the unit group is structured by combining the internal cells so that a total number of patterns contained in the combined internal cells does not exceed 500000 but is as approximate to 500000 as possible and so that the number of patterns contained in each unit group becomes substantially equal. On the occasion of structuring the unit group, if the internal cells with the smaller number of patterns contained therein are structured earlier into a unit group, the internal cells with the larger number of patterns contained therein are left later, it is therefore difficult to substantially equalize the numbers of patterns contained in the respective unit groups. Such being the case, in accordance with the first embodiment, the unit group is structured by combining alternately the cells with the smaller number of patterns contained therein and the cells with the larger number of patterns contained therein among the internal cells so that there is contained the number of patterns approximate to the unit group judging number of patterns, i.e., 500000. Structured herein are four unit groups such as a unit group 1 into which the cells A3, C, E are combined and of which the number of patterns is 460590, a unit group 2 into which the cells A2, D are combined and of which the number of patterns is 498000, a unit group 3 into which the cells A4, B are combined and of which the number of patterns is 496000, and a unit group 4 into which the cells A1, B1 are combined and of which the number of patterns is 491000.

Figure 10A:
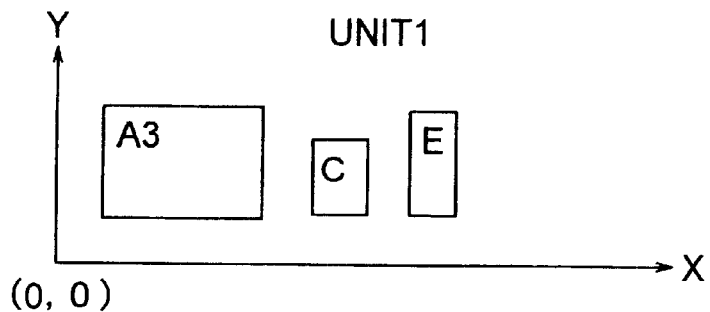
FIGS. 10A–10D are explanatory diagrams showing one example of contents of a mask data processing operation file with respect to the respective unit groups.
Figure 10B:
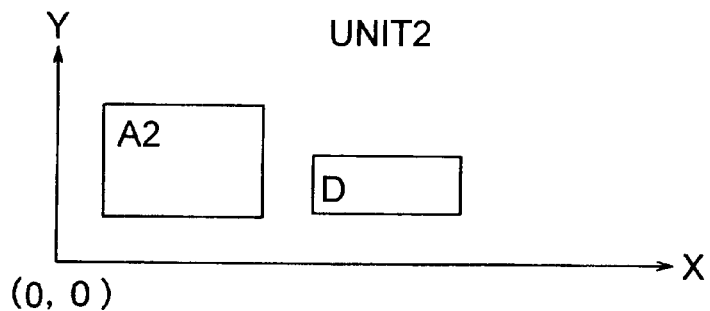
Figure 10C:
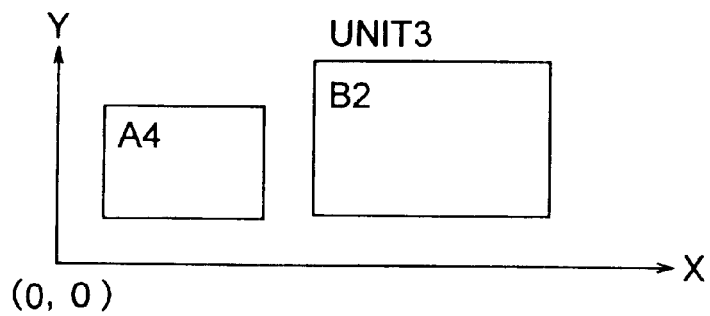
Figure 10D:
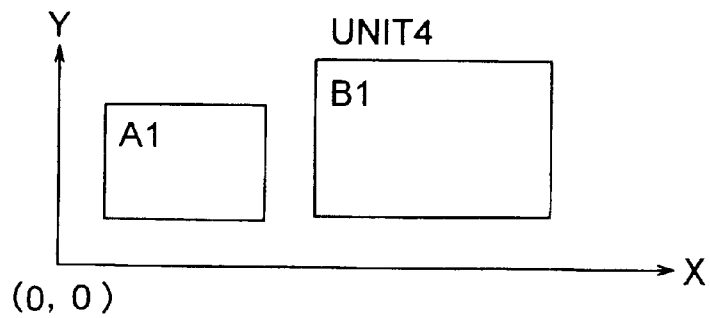

FIGS. 10A–10D are explanatory diagrams showing one example of contents of a mask data processing operation file with respect to each unit group. FIG. 10A shows the unit group 1. FIG. 10B shows the unit group 2. FIG. 10C shows the unit group 3. FIG. 10D shows the unit group 4.

The mask data processing operation file with respect to each unit group is created based on the internal cell number of each of the unit groups and the layout coordinate table shown in FIG. 9, wherein the internal cells of each unit group is disposed at a predetermined spacing. The predetermined spacing between the internal cells may be specified otherwise but may also be automatically determined based on the contents of the data processing in the following way. For instance, if the data working process of the internal cell is only a logic calculation such as AND, OR and NOT, etc., the internal cells are spaced by a value as minute as 1 $\mu$m. On the other hand, if the pattern data undergoes a comparatively large dimension compensating process in terms of a relationship with an accuracy of the process technology when actually manufacturing the LSI, the internal cells are disposed at a spacing that is over twice as large as a value to be compensated in dimension.

In accordance with the first embodiment, the internal cells are disposed at the predetermined spacing in the X-axial direction. The disposing direction is not limited to the X-axial direction but may be the Y-axial direction, a direction inclined at 45 degrees, and minus-value directions of the X- and Y-axes.

After creating the mask data processing operation file, the computer capable of processing the data in parallel such as the computer incorporating the plurality of tightly-coupled CPUs or the plurality of computers connected to the network, starts up a job of predetermined mask data processing. Then, referring to the internal format file created as described above, the internal cell numbers of the respective unit groups and the layout coordinate table, and the mask data processing operation file with respect to each unit group, the parallel processing control per unit group is performed while retaining the hierarchical structure of the LSI design layout data. The job to be started up is subjected to the parallel processing control according to a predetermined degree of parallelism.

For example, when the degree of parallelism is specified to 2, the parallel processing control is carried out in the following way. The LSI design layout data in the first embodiment is structured of the four unit groups, and hence, when executing the parallel processing, to begin with, the job is started up after creating the mask data processing operation file of the unit group 1. Subsequently, the mask data processing operation file of the unit group 2 is created, and the job is started up. Herein, since the degree of parallelism is specified to 2, the job starting process remains in a standby status till the process of the unit group 1 or 2 is ended, and a process of checking at an interval of a predetermined time whether or not the job has been finished, is repeated. Upon an end of the process of any one of the unit groups 1 and 2, post-processing of a result of the mask data processing of the unit group with its process being ended, is executed. Then, the mask data processing operation file of the unit group 3 is created, and the job is started up. The procedure given above is hereinafter repeated.

The way of how to specifically deal with the post-processing of the result of the mask data processing of each unit group is an item beyond the scope of the present invention, and hence details thereof are omitted. It is, however, feasible to make an easy return to the as-was internal cell from the mask data processing operation file with reference to the size of each internal cell stored in the internal format file, the internal cell number of each unit group and the layout coordinate table.

Further, in the case of the parallel processing being executed by the plurality of computers connected to the network, there are required a process of transferring the mask data operation file per unit group before starting up the job, and a process of transferring the result of the mask data processing to the post-processing computer after finishing the job.

Figure 11:
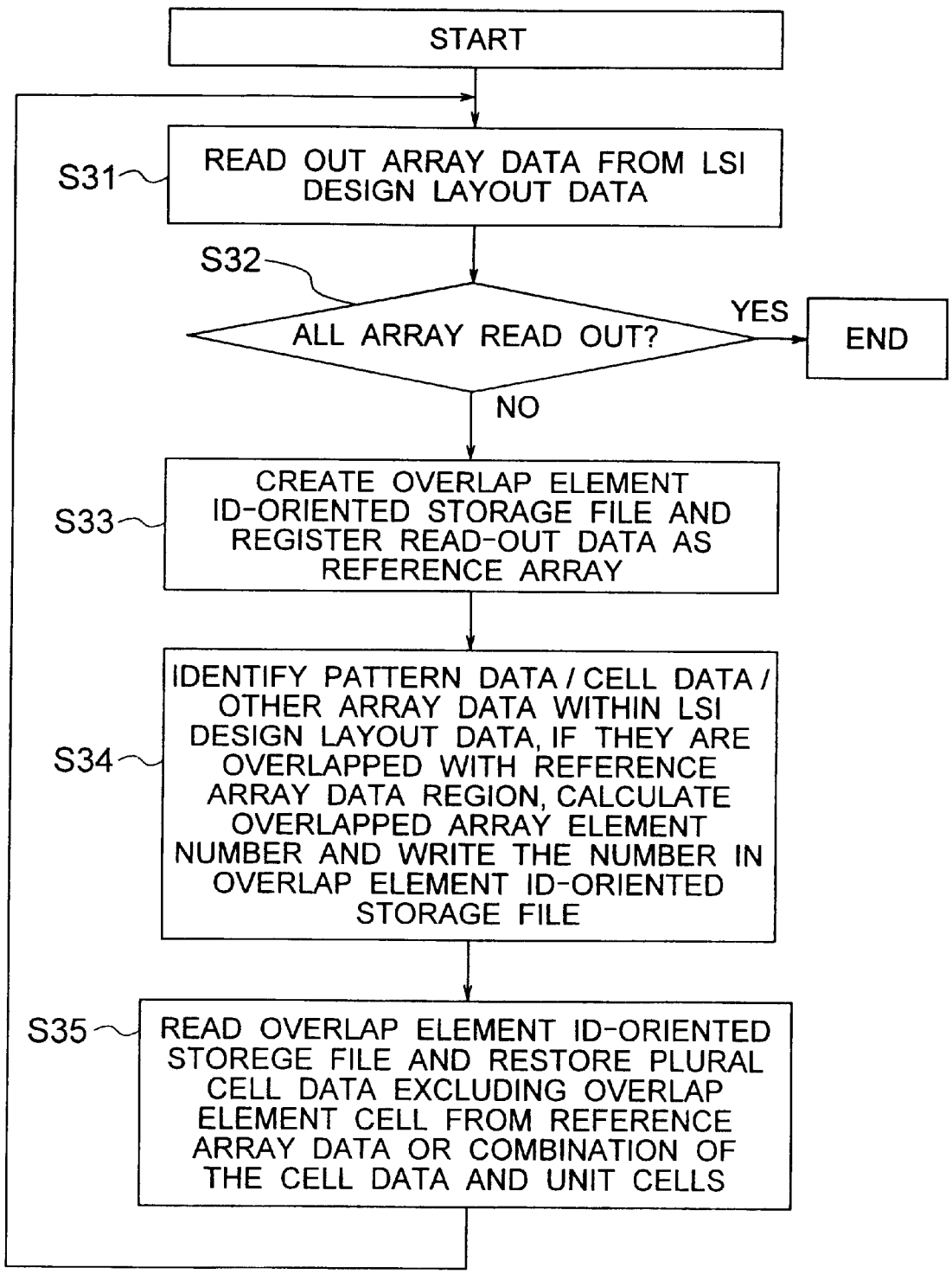
FIG. 11 is a flowchart showing a procedure of the integrated circuit design method in a second embodiment of the present invention.
Figure 12:
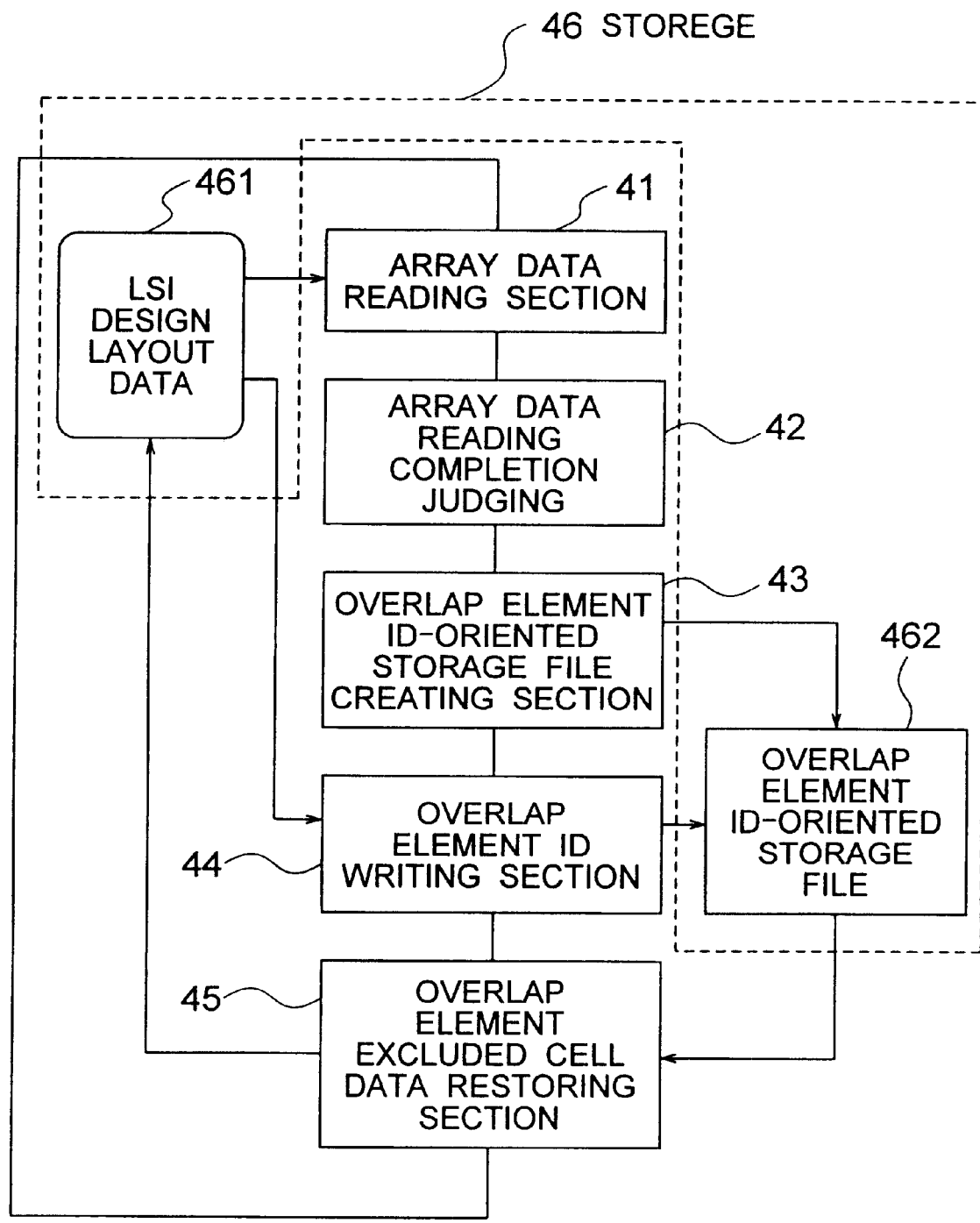
FIG. 12 is a block diagram showing a construction of the integrated circuit design apparatus in the second embodiment of the present invention.

FIG. 11 is a flowchart showing a procedure of the integrated circuit design method in a second embodiment of the present invention. FIG. 12 is a block diagram illustrating a construction of the integrated circuit design apparatus in the second embodiment of the present invention. The integrated circuit design method and the integrated circuit design apparatus in the second embodiment of the present invention, are related to the array cell restructuring method in the case of executing the hierarchical process of the LSI design layout data.

The integrated circuit design apparatus in the second embodiment of the present invention shown in FIG. 12 is constructed of a storage 46 for storing a variety of data such as LSI design layout data 461 etc, an array data reading section 41 for reading array data from pieces of LSI design layout data stored in the storage 46, an array data reading completion judging section 42 for judging whether or not the reading of all pieces of array data is completed, and an overlap element identification-oriented storage file creating section 43 for creating an overlap element identification-oriented storage file. The integrated circuit design apparatus is constructed further of an overlap data identification writing section 44 for identifying the pattern data and the cell data or the array data overlapped with an array cell element in a reference array data region in which to set reference array data among pieces of LSI design layout data, calculating an array cell element number of the overlap array cell element having he overlapped data, and writing this array cell element number to the data in the overlap element identification-oriented storage file which corresponds to the overlap array cell element, and an overlap element excluded cell data restoring section 45 for reading the overlap element identification-oriented storage file, and restoring a cell data region left by excluding the data of the overlap element cell from the reference array data region with a combination of a plurality of or a single piece of array cell or unit cell.

The integrated circuit design method in the second embodiment of the present invention shown in FIG. 11 is carried out as follows by use of the integrated circuit design apparatus in the second embodiment of the present invention shown in FIG. 12.

At first, the array data reading section 41 sequentially reads the array data among pieces of LSI design layout data 461 stored in the storage 46 (step S31). Herein, in the case of completing the reading of all pieces of array data, the processing comes to an end. If the reading of all pieces of array data is not completed, however, the processing proceed to next step (step S32).

After reading the array data, the overlap element identification-oriented storage file creating section 43 creates the overlap element identification-oriented storage file 462 in the storage 46, and registers the read-out array data set as the reference array data (step S33). Namely, the overlap element identification-oriented storage file 462 in a bitmap format is created with respect to the read-out array data, wherein all bit values are set to "0" implying "no overlap".

After creating the overlap element identification-oriented storage file 462, the overlap element identification writing section 44 identifies the pattern data and the cell data or other array data overlapped with the array cell element in the reference array data region in which to set the reference array data among pieces of LSI design layout data stored in the storage 46, and writes these pieces of data to the data in the overlap element identification-oriented storage file 462 which corresponds to the overlap array cell element having the overlapped data (step S34). More specifically, array layout coordinates and repetitive pitch coordinates are compared with coordinate values of the overlapped pattern data and cell data or other array data, thereby calculating an overlapped array element number. A bit value of the overlapped array element is rewritten to "1" giving an implication of being "overlapped".

Thereafter, the overlap element excluded cell data restoring section 45 reads the overlap element identification-oriented storage file 462, and restores the data region left by excluding the cell data of the overlap element cell contained in the overlap array cell element from the reference array data region with a combination of a plurality of or a single piece of array cell or unit cell (step S35). To be more specific, there are performed three operations of (1) deleting the reference array cell data from the LSI design layout data, (2) developing the overlap element array cell data, and (3) writing, to the LSI design layout data, the combination of the plurality of or single piece of array cell or unit cell from the overlap element identification-oriented storage file 462.

After restoring the data region, with respect to the restoration data region restored, the data are processed while retaining the data hierarchical structure of the data, only the data in the overlap data region excluded from the restored data region due to the data overlap is developed or converted into the unit cell data, thus executing the data processing.

Figures 13, 14:
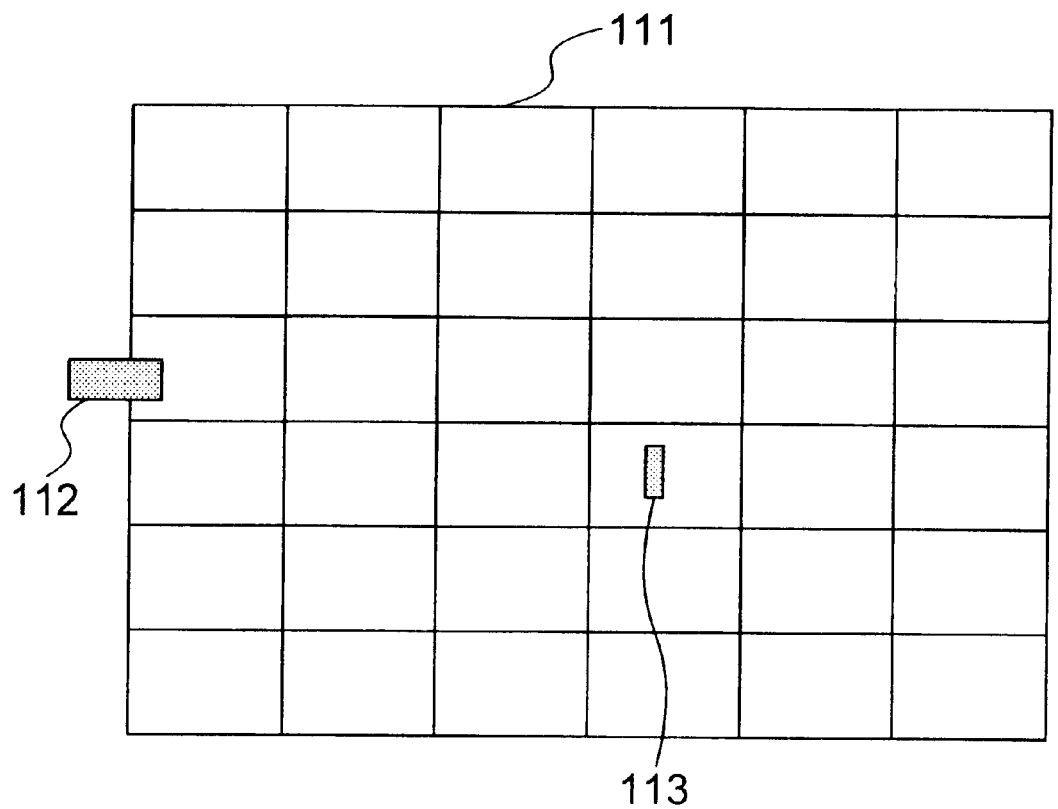
FIG. 13 is an explanatory diagram showing one example of structures of reference array data and overlapped data.
FIG. 14 is an explanatory diagram showing one example of an overlap element identification-oriented storage file created based on the structures of the reference array data and the overlapped data shown in FIG. 13.

FIG. 13 is an explanatory diagram showing one example of the structures of the reference array data and the overlap data.

The reference array data 111 shown in FIG. 13 is structured of six rows and six columns, wherein two pieces of pattern data 112, 113 are so disposed as to be superposed on two array elements in the reference array data region 111.

FIG. 14 is an explanatory diagram showing one example of the overlap element identification-oriented storage file created based on the structures of the reference array data and the overlap data shown in FIG. 13.

FIG. 14 shows an example in which the overlap element identification-oriented storage file is created in the bitmap format, wherein each array element of the array data corresponds to each piece of bit data. That is, when the reference array data is defined as the 6-rows×6-columns secondary array as shown in FIG. 13, the overlap element identification-oriented storage file also becomes the 6-rows×6-columns bitmap. The bit data "0" indicates the array element with no overlap disposition, while the bit data "1" indicates the array element with an overlap disposition.

FIG. 15 is an explanatory diagram showing a structure of the array data restored from the overlap element identification-oriented storage file shown in FIG. 14, in which FIGS. 15A through 15F show six examples.

Figure 15A:
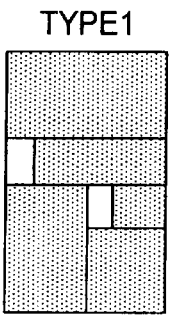
FIGS. 15A–15F are explanatory diagrams showing a structure of the array data restored from the overlap element identification-oriented storage file shown in FIG. 14.
Figure 15B:
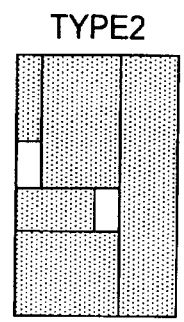
Figure 15C:
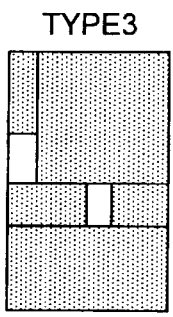
Figure 15D:
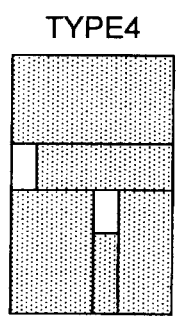
Figure 15E:
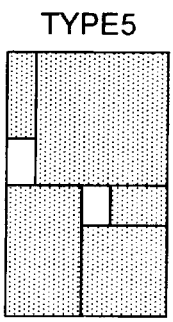
Figure 15F:
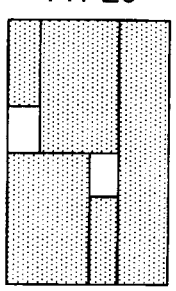

The number of minimum restoration arrays in the examples in FIGS. 13 and 14 is five. In each of the examples of types 1 through 6 shown in FIGS. 15A through 15F, cell data regions (colored) left by excluding the overlap element cells (white areas) from the reference array data region, are restored by a combination of the five sets of the numbers of minimum restoration arrays. Namely, the cell data regions left by excluding the overlap element cells from the reference array data region are restored by a combination of five arrays such as 6×2, 5×1, 3×3, 2×1, 3×2 in the type 1 in FIG. 15A, a combination of five arrays such as 1×2, 3×3, 2×6, 3×1, 4×2 in the type 2 in FIG. 15B, a combination of five arrays such as 1×2, 5×3, 3×1, 2×1, 6×2 in the type 3 in FIG. 15C, a combination of five arrays such as 6×2, 5×1, 3×3, 1×2, 2×3 in the type 4 in FIG. 15D, a combination of five arrays such as 1×2, 5×3, 3×3, 2×1, 3×2 in the type 5 in FIG. 15E, and a combination of five arrays such as 1×2, 3×3, 2×6, 3×3, 1×2 in the type 6 in FIG. 15F. The type 3 in FIG. 15C shows an example in which the secondary arrays of 5×3 and 6×2 are restored in sequence from the secondary array with a larger number of repetitions.

The continuous element in the X-axial direction is retrieved, and thereafter the array is restored by retrieving the element repeated in the Y-axial direction with a width of the retrieved continuous element, in which case this comes under the type 3 or 4. The type 3 corresponds to a case where the element repeated in the Y-axial direction with the width of the continuous element in the X-axial direction is retrieved in such a direction that the Y-value increases. The type 4 corresponds to a case where the element repeated in the Y-axial direction with the width of the continuous element in the X-axial direction is retrieved in such a direction that the Y-value decreases.

The continuous element in the Y-axial direction is retrieved, and thereafter the array is restored by retrieving the element repeated in the X-axial direction with a width of the retrieved continuous element, in which case this comes under the type 1 or 2.

The type 1 corresponds to a case where the element repeated in the X-axial direction with the width of the continuous element in the Y-axial direction is retrieved in such a direction that the X-value increases. The type 2 corresponds to a case where the element repeated in the X-axial direction with the width of the continuous element in the Y-axial direction is retrieved in such a direction that the X-value decreases.

The types 5 and 6 are classified as types in which no array is restored any one of the methods described above, however, the array can be restored in the types 5 and 6 by adding some modifications to the basic restoring methods described above.

According to the integrated circuit design method and the integrated circuit design apparatus in the second embodiment of the present invention, the non-overlap array data region left by excluding the data region having the overlapped data from the array data region in which to contain the array data in the integrated circuit design layout data, is restored by the combination of the plurality of or the single piece of array cell or unit cell. Therefore, after restoring the data region, the data contained in the restored data region is processed while retaining the hierarchical structure of the integrated circuit design layout data, and, with the overlap of the data, only the data contained in the overlap data region excluded from the restored data region is developed or converted into the unit cell data, thus effecting the data processing. There is eliminated the operation of developing the array cell data up to the region with non-overlapped data and processing the data by converting all pieces of array data into the unit cell data, and it is feasible to reduce large quantities of the processing time and of the capacity of the operation storage file.

In the case of actually processing the integrated circuit design layout data in the integrated circuit design, when processing the data by the integrated circuit design method and the integrated circuit design apparatus in the first embodiment of the present invention after processing the data by the integrated circuit design method and the integrated circuit design apparatus in the second embodiment of the present invention, the effects in the first and second embodiment can be obtained, and the integrated circuit design layout data can be processed at a higher efficiency.

Figure 16:
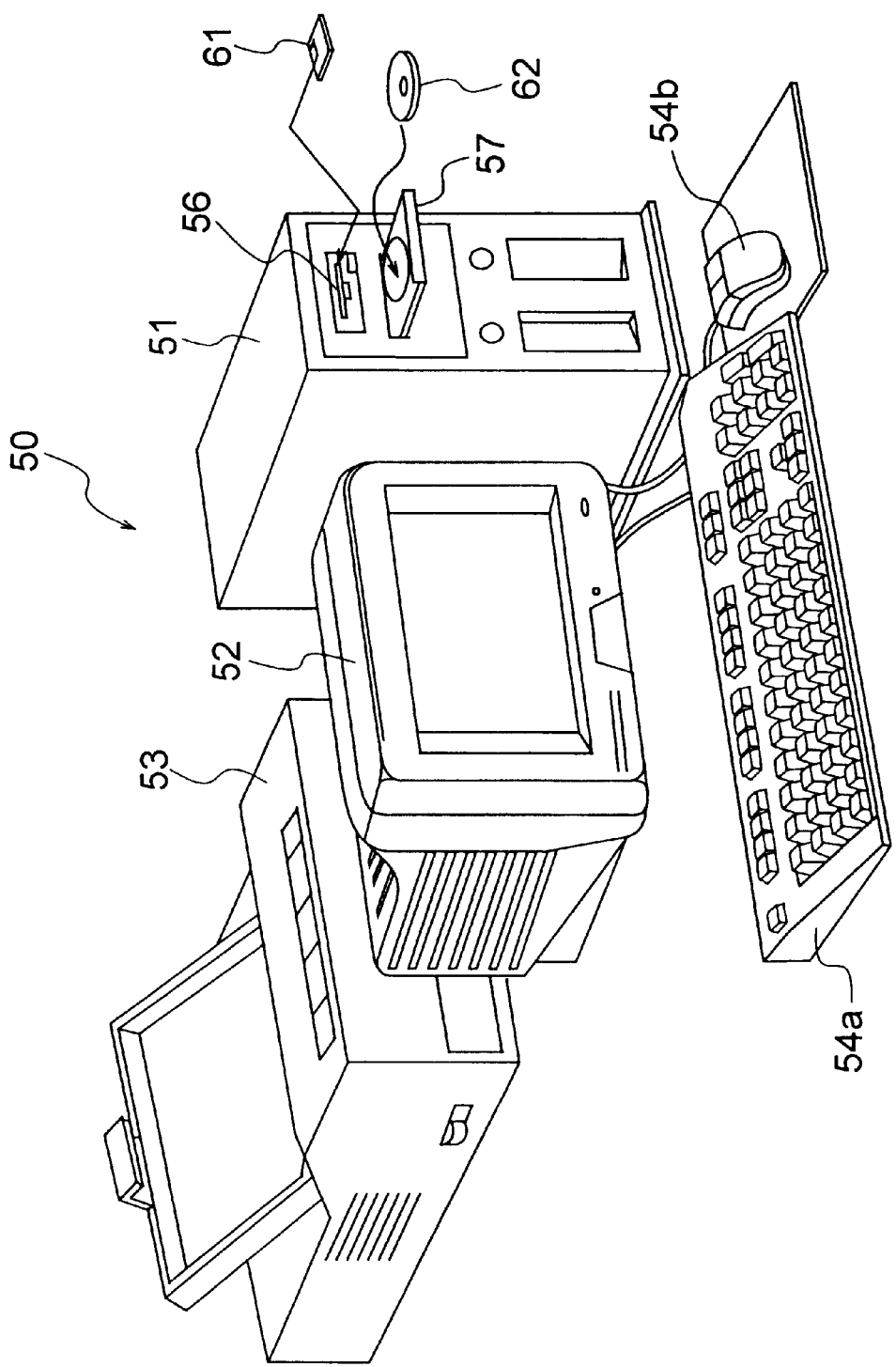
FIG. 16 is an explanatory view illustrating external configurations of a recording medium recorded with a program for executing the integrated circuit design method in the first or second embodiment of the present invention, and of a computer system in which to use this recording medium.
Figure 17:
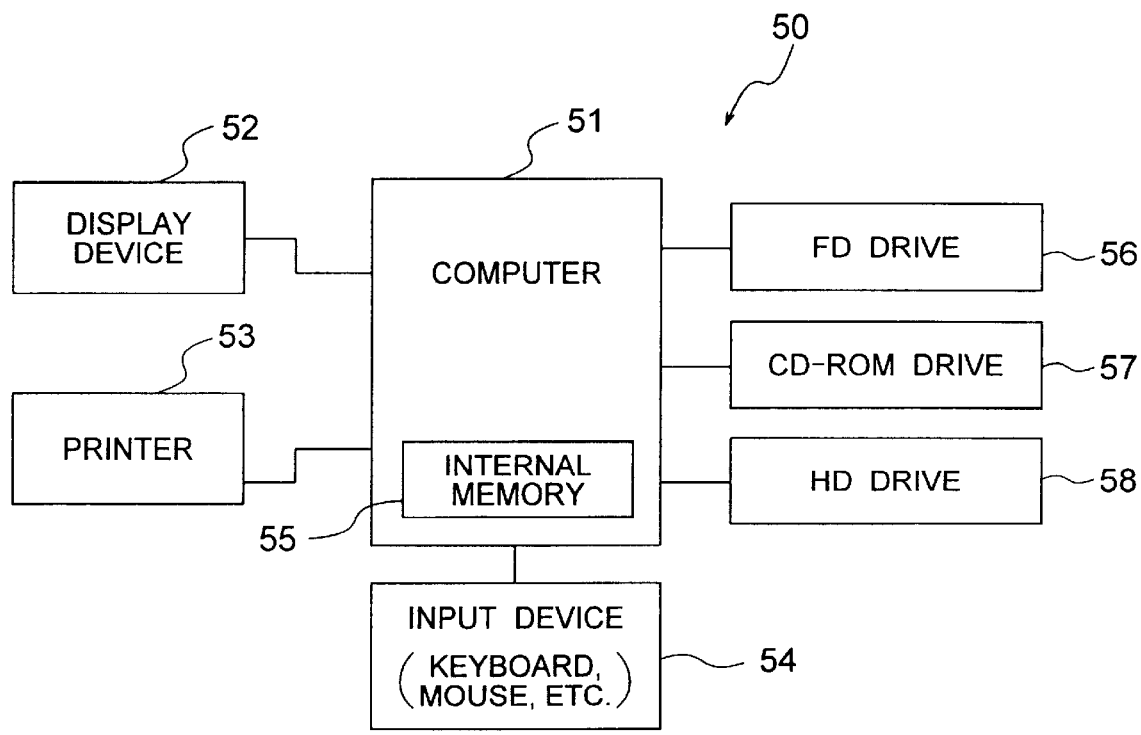
FIG. 17 is a block diagram showing an architecture of the computer system shown in FIG. 16.

FIG. 16 is an explanatory diagram showing an external configuration of a computer system and a recording medium used therein and recorded with a computer program for executing the integrated circuit design method in the first or second embodiment of the present invention. FIG. 17 is a block diagram showing an architecture of the computer system shown in FIG. 16.

The computer system shown in FIG. 16 is constructed of a computer main body 51 incorporated into a mini tower type box body etc, a display device 52 such as a CRT (Cathode Ray Tube), a plasma display and a liquid crystal display device etc, a printer 53 serving as a record outputting device, keyboard 54*a* and a mouse 54*b* serving as input devices, a flexible disk drive 56, and a CD-ROM drive 57. FIG. 17 is the block diagram showing the architecture of this computer system, wherein the box body accommodating the computer main body 51 is further provided with an internal memory 55 such as a RAM Random Access Memory) etc, and an external memory such as a hard disk drive 58, etc. This computer system uses the recording medium recorded with the computer program for executing the integrated circuit design method in the first or second embodiment of the present invention. The recording medium involves the use of, e.g., a flexible disk 61 and a CD=ROM (Read Only Memory) 62, however, there may also be used other mediums such as an MO (Magneto-optical) disk, a DVD (Digital Versatile Disk), other optical recording disks, a card memory and a magnetic tape etc.

According to the integrated circuit design method and the integrated circuit design apparatus based on the first construction of the present invention, the internal cell consists of the divided cell obtained by dividing the design cell specified by the design cell data among pieces of the integrated circuit design layout data on the basis of the cell division judging criterion, and of the non-divided design cell other than the divided cell, and the internal cells are combined, thus creating the plurality of unit groups of which data quantities are substantially equal to each other. Then, the hierarchical parallel processing of the data contained in the internal cell is executed per unit group, whereby times for per-unit-group data processes executed in parallel are substantially equalized and the hierarchical parallel processing of the LSI design layout data can be executed most efficiently.

According to the integrated circuit design method and the integrated circuit design apparatus based on the second construction of the present invention, the non-overlap array data region left by excluding the data region having the overlapped data from the array data region in which to contain the array data in the integrated circuit design layout data, is restored by the combination of the plurality of or the single piece of array cell or unit cell. Therefore, after restoring the data region, the data contained in the restored data region is processed while retaining the hierarchical structure of the integrated circuit design layout data, and, with the overlap of the data, only the data contained in the overlap data region excluded from the restored data region is developed or converted into the unit cell data, thus enabling the data processing to be executed. There is eliminated the operation of developing the array cell data up to the region with non-overlapped data and processing the data by converting all pieces of array data into the unit cell data, and it is feasible to reduce large quantities of the processing time and of the capacity of the operation storage file.

The recording medium of the computer program according to the present invention is recorded with the computer program for executing the integrated circuit design method based on the first or second construction of the present invention by use of the computer system, and it is therefore possible to obtain the effects of the integrated circuit design method based on the first or second construction of the present invention.

What is Claimed is:

1. A method of designing an integrated circuit, comprising:

a first step of sequentially reading design cell data about design cells among pieces of integrated circuit design layout data stored in storage section;

a second step of, with reference to the design cell data and a predetermined cell division judging criterion, dividing into divided cells the design cell among the design cells which exceeds the cell division judging criterion, converting the design cell data into internal cell data about an internal cell consisting of the divided cell and the design cell other than the divided cell, storing the internal cell data in an internal format file created in said storage section, and recording information for identifying the respective internal cells and a quantity of the data comprising data size or data area contained in each internal cell in an internal cell identification number table created in said storage section, a third step of repeating said first step and said second step till said first and second steps are completed with respect to all pieces of design cell data;

a fourth step of creating a plurality of unit groups by combining the internal cells so that the quantity of the data becomes approximates to a predetermined reference data quantity with reference to the quantity of the data contained in each internal cell which is registered in the internal cell identification number table, and registering information for identifying the respective unit groups in a unit group table created in said storage section; and a fifth step of processing the internal cell data stored in the internal format file under parallel processing control per unit group with reference to the internal cell identification number table and the unit group.

2. A method of designing an integrated circuit according to claim 1, further comprising:

a step of previously creating in said storage section, when executing the data processing in said fifth step, a mask data processing operation file in which the internal cells are disposed at a predetermined spacing per unit group with reference to the unit group table, and executing the data processing with reference to the mask data processing operation file.

3. A method of designing an integrated circuit according to claim 1, Wherein the cell division judging criterion is at least one of whether or not the quantity of the data contained in the design cell exceeds a reference data quantity, and whether or not a dimension of the design cell in a direction of vertical or horizontal axis on a design plane exceeds a reference dimension.

4. A method of designing an integrated circuit according to claim 1, wherein the unit group is structured by combining alternately the cells with the smaller number of patterns contained in each unit group and the cells with the larger number of patterns contained therein among the internal cells so that the quantities of the data contained in the respective unit groups become substantially equal to each other.

5. An apparatus for designing an integrated circuit, comprising:

storage section for storing integrated circuit design layout data and other pieces of data, a computer capable of processing the data in parallel;

design cell data reading section for reading design cell data about design cells among pieces of integrated circuit design layout data stored in said storage section;

cell data converting/writing section for, with reference to the design cell data and a predetermined cell division judging criterion, dividing into divided cells the design cell among the design cells which exceeds the cell division judging criterion, converting the design cell data into internal cell data about an internal cell consisting of the divided cell and the design cell other than the divided cell, storing the internal cell data in an internal format file created in said storage section, and recording information for identifying the respective internal cells and a quantity of the data comprising data size or data area contained in each internal cell in an internal cell identification number table created in said storage section;

cell data conversion completion judging section for judging whether or not the conversion of all pieces of design cell data is completed;

unit group creating section for creating a plurality of unit groups by combining the internal cells so that the quantity of the data becomes approximates to a predetermined reference data quantity with reference to the quantity of the data contained in each internal cell which is registered in the internal cell identification number table, and registering information for identifying the respective unit groups in a unit group table created in said storage section; and parallel processing control section for processing the internal cell data stored in the internal format file under parallel processing control per unit group by use of said computer with reference to the internal cell identification number table and the unit group.

6. A recording medium for a computer program, recorded with the computer program for executing in a computer system a integrated circuit design method comprising:

a first step of sequentially reading design cell data about design cells among pieces of integrated circuit design layout data stored in storage section;

a second step of, with reference to the design cell data and a predetermined cell division judging criterion, dividing into divided cells the design cell among the design cells which exceeds the cell division judging criterion, converting the design cell data into internal cell data about an internal cell consisting of the divided cell and the design cell other than the divided cell, storing the internal cell data in an internal format file created in said storage section, and recording information for identifying the respective internal cells and a quantity of the data comprising data size or data area contained in each internal cell in an internal cell identification number table created in said storage section;

a third step of repeating said first step and said second step till said first and second steps are completed with respect to all pieces of design cell data;

a fourth step of creating a plurality of unit groups by combining the internal cells so that the quantity of the data becomes approximates to a predetermined reference data quantity with reference to the quantity of the data contained in each internal cell which is registered in the internal cell identification number table, and registering information for identifying the respective unit groups in a unit group table created in said storage section; and a fifth step of processing the internal cell data stored in the internal format file under parallel processing control per unit group with reference to the internal cell identification number table and the unit group.

* * * * *